US012658251B2

(12) United States Patent
Moriwaki

(10) Patent No.: US 12,658,251 B2
(45) Date of Patent: Jun. 16, 2026

(54) SEMICONDUCTOR MEMORY DEVICE

(71) Applicant: Socionext Inc., Kanagawa (JP)

(72) Inventor: Shinichi Moriwaki, Yokohama (JP)

(73) Assignee: Socionext Inc., Kanagawa (JP)

( * ) Notice: Subject to any disclaimer, the term of this patent is extended or adjusted under 35 U.S.C. 154(b) by 135 days.

(21) Appl. No.: 18/883,220

(22) Filed: Sep. 12, 2024

(65) Prior Publication Data

US 2025/0006258 A1    Jan. 2, 2025

Related U.S. Application Data

(63) Continuation of application No. PCT/JP2022/011673, filed on Mar. 15, 2022.

(51) Int. Cl.
*G11C 11/419*    (2006.01)
*G11C 11/412*    (2006.01)

(52) U.S. Cl.
CPC .......... *G11C 11/419* (2013.01); *G11C 11/412* (2013.01)

(58) Field of Classification Search
CPC .... G11C 11/419; G11C 11/412; G11C 11/418
USPC .................................................... 365/189.16
See application file for complete search history.

(56) References Cited

U.S. PATENT DOCUMENTS

2009/0161449 A1    6/2009    Yamagami
2012/0075936 A1*    3/2012    Fujimura .............. G11C 11/413
                                                          365/189.09

2015/0279454 A1*    10/2015    Sano ..................... G11C 11/419
                                                          365/189.09
2016/0118091 A1    4/2016    Asenov et al.
2017/0092378 A1*    3/2017    Tanaka ............. G11C 29/50016
2018/0047457 A1*    2/2018    Tanaka ............. G11C 29/50016

FOREIGN PATENT DOCUMENTS

JP    2009-151847 A    7/2009
JP    2012-69214 A    4/2012

OTHER PUBLICATIONS

International Search Report dated May 24, 2022, from corresponding International Application No. PCT/JP2022/011673, 5 pages.

* cited by examiner

*Primary Examiner* — Fernando Hidalgo
(74) *Attorney, Agent, or Firm* — Rimon P.C.

(57)    ABSTRACT

A semiconductor memory device includes: a memory cell array including a plurality of memory cells each connected to a bit line pair; and a write circuit that brings a low potential-side bit line to a negative potential in response to a negative potential boost signal. At the data read operation, a word line is activated after a lapse of a first predetermined time from a transition of an input clock signal, to read the memory value of the memory cell. At the data write operation, the word line is activated after a lapse of a second predetermined time longer than the first predetermined time from a transition of the input clock signal, and the negative potential boost signal is activated after a lapse of a third predetermined time longer than the first predetermined time.

4 Claims, 9 Drawing Sheets

FIG.5A

SEMICONDUCTOR MEMORY DEVICE

CROSS-REFERENCE TO RELATED APPLICATIONS

This is a continuation of International Application No. PCT/JP2022/011673 filed on Mar. 15, 2022. The entire disclosure of this application is incorporated by reference herein.

BACKGROUND

The present disclosure relates to a semiconductor memory device.

In recent years, as semiconductor processes are increasingly miniaturized, voltages of semiconductor devices are becoming lower, and this raises a problem of ensuring stable write operation to static random access memory (SRAM). To address this problem, a write assist technique using a negative bit-line scheme is conventionally known.

For example, in Japanese Unexamined Patent Publication No. 2009-151847, a capacitive element for generating a negative potential for bit lines of an SRAM is provided. At the time of write into the SRAM, a control signal for the capacitive element is changed after a word line is activated and before a bit line becomes 0 V, whereby the write assist operation of the negative bit-line scheme is achieved.

In the prior-art technique, however, the bit line is changed to an L level while the word line is in the activated state. This allows a through current to flow until when the memory value of the memory is inverted, causing a problem of increasing the power consumption.

Also, in the prior-art technique, in which the control signal is changed before the bit line becomes 0 V, there is a case where the potential of the bit line has not yet sufficiently decreased at the time of control of the capacitive element. If the capacitive element is operated for generation of a negative potential in such a state where the potential of the bit line has not yet sufficiently decreased, it is unable to bring the bit line to a sufficiently negative potential. This makes the write operation unstable, resulting in decrease in yield and reliability.

To address the above problem, in order to bring the bit line to a sufficiently negative potential under the control of the capacitive element even in the state where the potential of the bit line has not yet sufficiently decreased (including the state where the potential of the bit line is a little floating from 0 V due to a through current), it is considered to increase the capacitance value of the capacitive element. This however raises a problem of increasing the area.

Moreover, in the prior-art technique, when the word line is activated, a current flows from a bit line having an L-level memory value through a path to a memory cell in an unselected memory cell column where no write is performed. This current flowing state continues during the period for which the word line is in an H level, causing a problem of increasing the power consumption.

An objective of the present disclosure is providing a semiconductor memory device that solves the above problems without causing decrease in read speed.

SUMMARY

According to one mode of the present disclosure, a semiconductor memory device performing read operation and write operation in response to an input clock signal, includes: a memory cell array including a plurality of memory cells, each of the plurality of memory cells being connected to a corresponding word line and a corresponding bit line pair; and a write circuit having a function of giving a low potential to one bit line of the bit line pair connected to the memory cell of a write target, and bringing the low potential-side bit line to a negative potential in response to a negative potential boost signal, wherein at a data read operation from the memory cell, the word line is activated after a lapse of a first predetermined time from a transition of the input clock signal, to read a memory value of the memory cell, and at a data write operation into the memory cell, the word line is activated after a lapse of a second predetermined time longer than the first predetermined time from a transition of the input clock signal, and the negative potential boost signal is activated after a lapse of a third predetermined time longer than the first predetermined time, to bring the low potential-side of the bit line pair to a negative potential.

According to the above mode, in comparison with the read operation of reading the memory value of the memory cell, the timing of activating the word line is delayed from the transition of the input clock signal at the write operation. With this, since the potential of the bit line can be sufficiently lowered speedily with certainty, the word line is to be activated after the potential of the bit line has sufficiently decreased. Therefore, since a through current flowing through a bit line of the selected column can be prevented or reduced, reduction in power consumption is achieved.

Also, in comparison with the read operation of reading the memory value of the memory cell, the timing of bringing one bit line of the write-target bit line pair to a negative potential is delayed at the write operation. With this, the potential of the bit line can be made negative with certainty, whereby stable write operation can be achieved. This can improve the yield and the reliability. Moreover, since the bit line is subjected to boosting to a negative potential at the point where the potential is sufficiently low, it is unnecessary to increase the capacitance value of a capacitive element for obtaining a negative potential, so that increase in the area of the semiconductor memory device can be avoided.

According to the present disclosure, in a semiconductor memory device, while the read speed is maintained as high as possible in the read operation, the operation of bringing a bit line to a negative potential, i.e., the write assist operation is started after the potential of the bit line has been sufficiently lowered speedily with certainty in the write operation. Therefore, the write margin can be improved compared with the prior-art technique.

BRIEF DESCRIPTION OF THE DRAWINGS

FIG. 5A is a view corresponding to FIG. 1A for a semiconductor memory device (second embodiment).

DETAILED DESCRIPTION

Figure 1A:
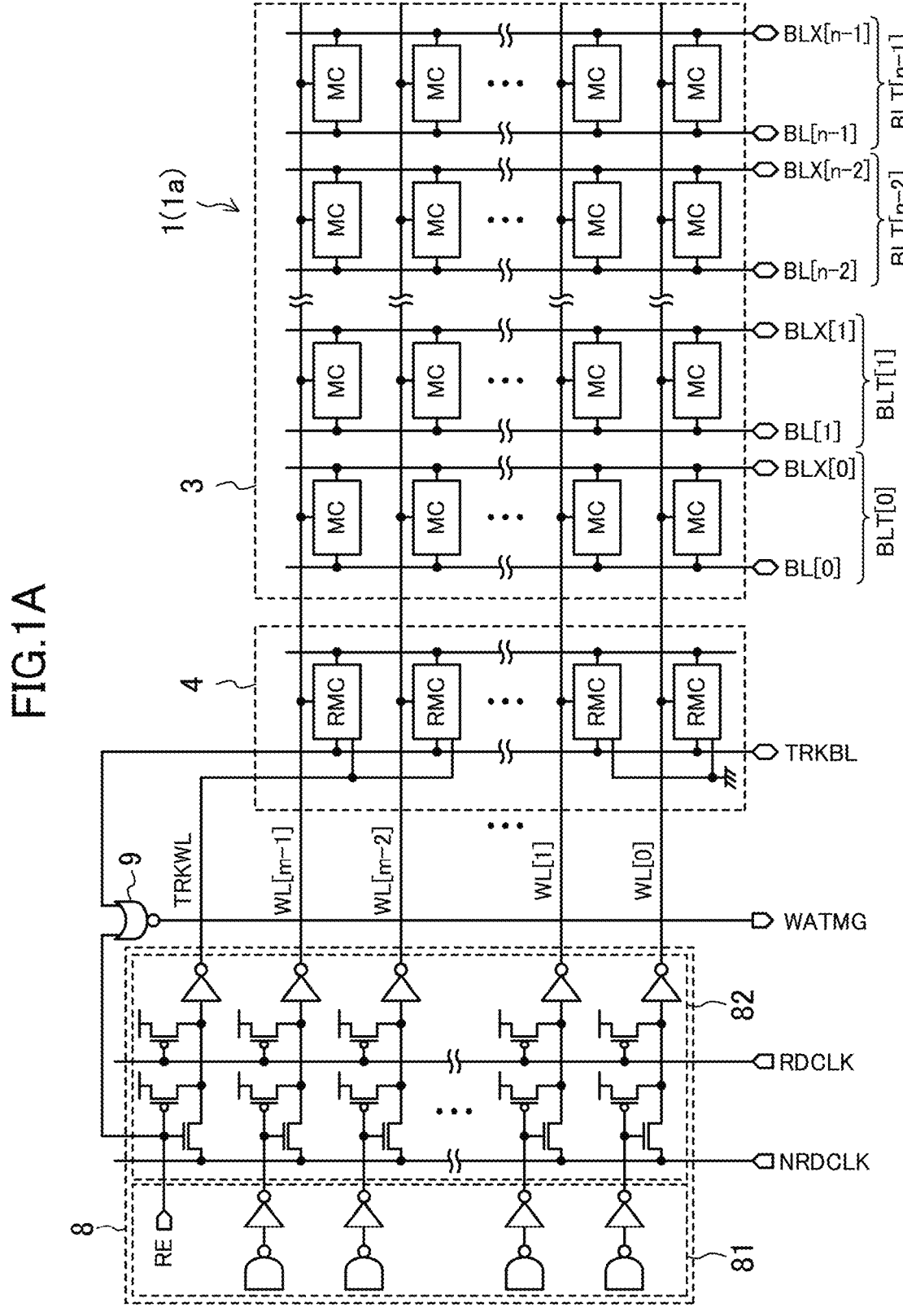
FIG. 1A is a functional block diagram illustrating part of a configuration of a semiconductor memory device (first embodiment).

Embodiments of the present disclosure will be described hereinafter with reference to the accompanying drawings. Note that, in the following description, the same reference character may be used for representing a signal line and a signal passing through the signal line.

First Embodiment

A semiconductor memory device 1 includes a memory cell array 3, a replica bit line circuit 4, an amplifier circuit 2, and a control circuit 6.

Figure 1B:
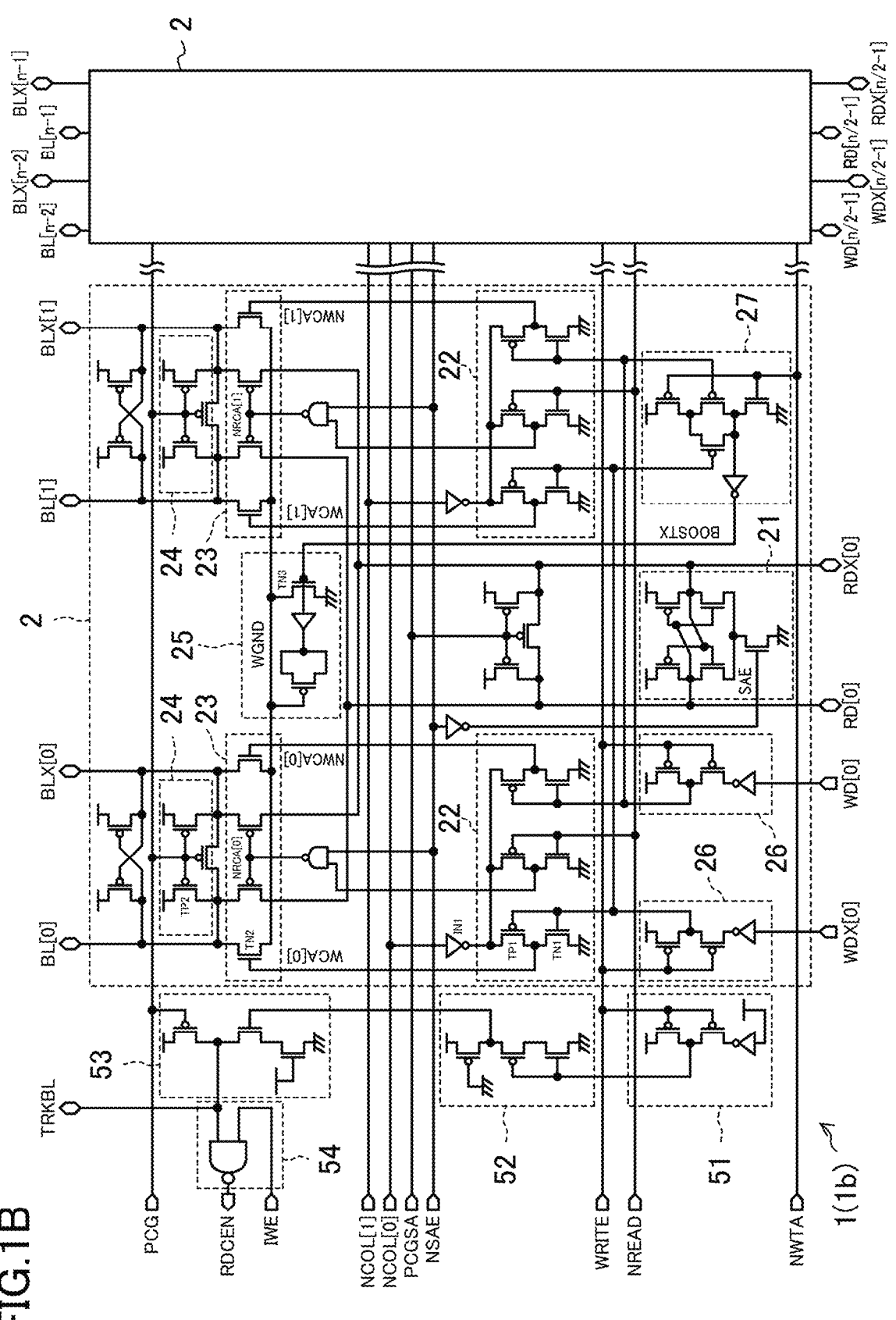
FIG. 1B is a view showing a circuit configuration example of an amplifier circuit constituting the semiconductor memory device (first embodiment).
Figure 1C:
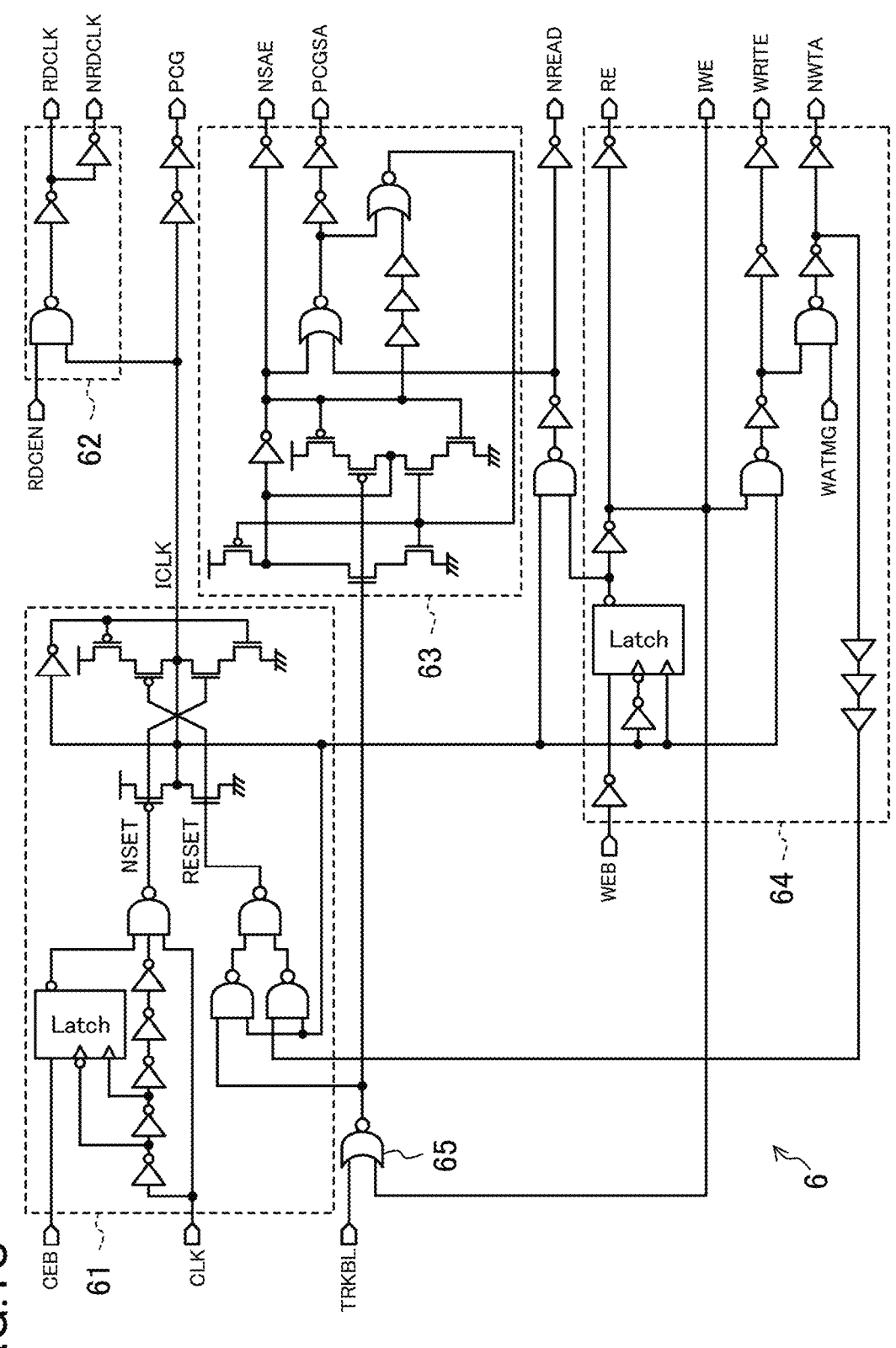
FIG. 1C is a view showing a circuit configuration example of a control circuit constituting the semiconductor memory device (first embodiment).

FIGS. 1A-1C show a configuration example of the semiconductor memory device 1 of the first embodiment. Specifically, the semiconductor memory device 1 includes a configuration 1a of FIG. 1A, a configuration 1b of FIG. 1B, and the control circuit 6 of FIG. 1C. FIG. 1A shows, as the configuration 1a, an configuration example of the memory cell array 3, the replica bit line circuit 4, and their peripheral circuits. FIG. 1B shows, as the configuration 1b, a configuration example of the amplifier circuit 2 and its peripheral circuits.

—Memory Cell Array—

As shown in FIG. 1A, the memory cell array 3 includes a plurality of memory cells MC arranged in an array of m rows (m is a natural number)×n columns (n is a natural number).

The memory cell array 3 includes a plurality of (m in FIG. 1A) word lines WL placed in correspondence with the rows of the memory cells MC and a plurality of (n in FIG. 1A) bit line pairs BLT placed in correspondence with the columns of the memory cells MC. The bit line pairs BLT are each constituted by paired bit lines BL and BLX. The word lines WL extend in a first direction (hereinafter called a "row direction"). The bit lines BL and BLX extend in a second direction (hereinafter called a "column direction") perpendicular to the first direction. Each of the memory cells MC is connected to a word line WL and a bit line pair BLT (bit lines BL and BLX) of the row and the column, respectively, corresponding to the position of the memory cell MC.

The word lines WL are connected to a word line driver 8. The word line driver 8 includes a row decoder 81 and a driver circuit 82. The row decoder 81 decodes a row address designated from a CPU (not shown). The driver circuit 82 is a driver that activates a word line WL corresponding to an address decoded by the row decoder 81.

The bit line pairs BLT are connected to the amplifier circuit 2 to be described later.

Figure 2:
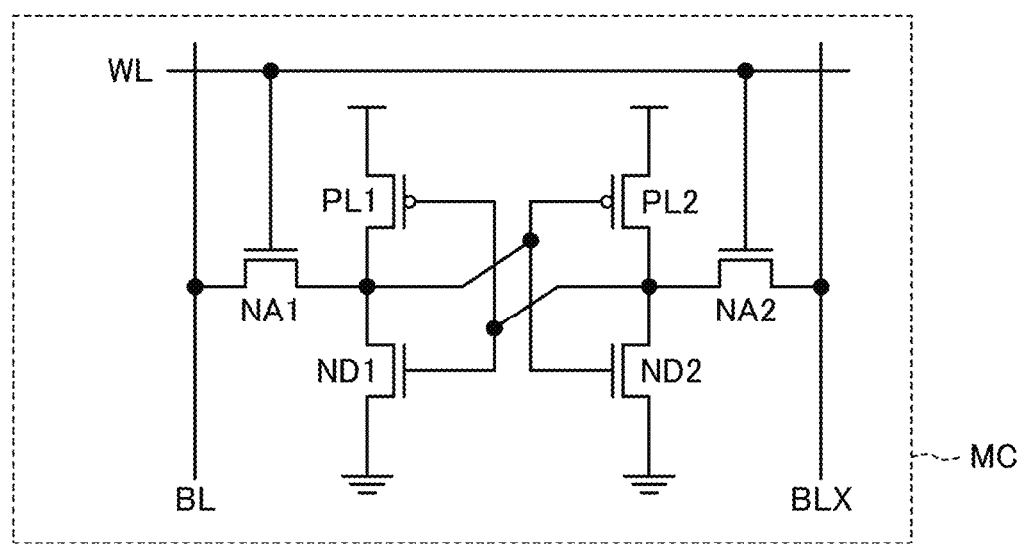
FIG. 2 is a view showing a circuit configuration example of a memory cell in FIG. 1A.

FIG. 2 is a circuit diagram showing an internal configuration of the memory cell MC in FIG. 1A. In FIG. 2, the memory cell MC includes n-type transistors NA1 and NA2, p-type transistors PL1 and PL2, and n-type transistors ND1 and ND2.

The n-type transistor NA1 is connected to the word line WL at its gate and to the bit line BL at its source. The n-type transistor NA2 is connected to the word line WL at its gate and to the bit line BLX at its source. The p-type transistor PL1 is supplied with the power supply voltage VDD at its source and connected to the drain of the n-type transistor NA1 at its drain. The n-type transistor ND1 is connected to the gate of the p-type transistor PL1 at its gate, to the drain of the p-type transistor PL1 at its drain, and to the ground potential VSS at its source. The p-type transistor PL2 is connected to the drain of the n-type transistor NA1 at its gate, supplied with the power supply voltage VDD at its source, and connected to the drain of the n-type transistor NA2 at its drain. The n-type transistor ND2 is connected to the gate of the p-type transistor PL2 at its gate, to the drain of the p-type transistor PL2 at its drain, and to the ground potential VSS at its source. The connection node of the gate of the p-type transistor PL1 and the gate of the n-type transistor ND1 is connected to the drain of the n-type transistor NA2.

The p-type transistor PL1 and the n-type transistor ND1 constitute a first inverter, and the p-type transistor PL2 and the n-type transistor ND2 constitute a second inverter. The input terminal of the first inverter is connected to the output terminal of the second inverter, and the output terminal of the first inverter is connected to the input terminal of the second inverter, whereby a latch circuit is formed.

—Replica Bit Line Circuit—

Referring back to FIG. 1A, the replica bit line circuit 4 includes a plurality of replica memory cells RMC arranged in line in the column direction. In the example of FIG. 1A, the replica bit line circuit 4 includes m replica memory cells RMC.

Figure 3:
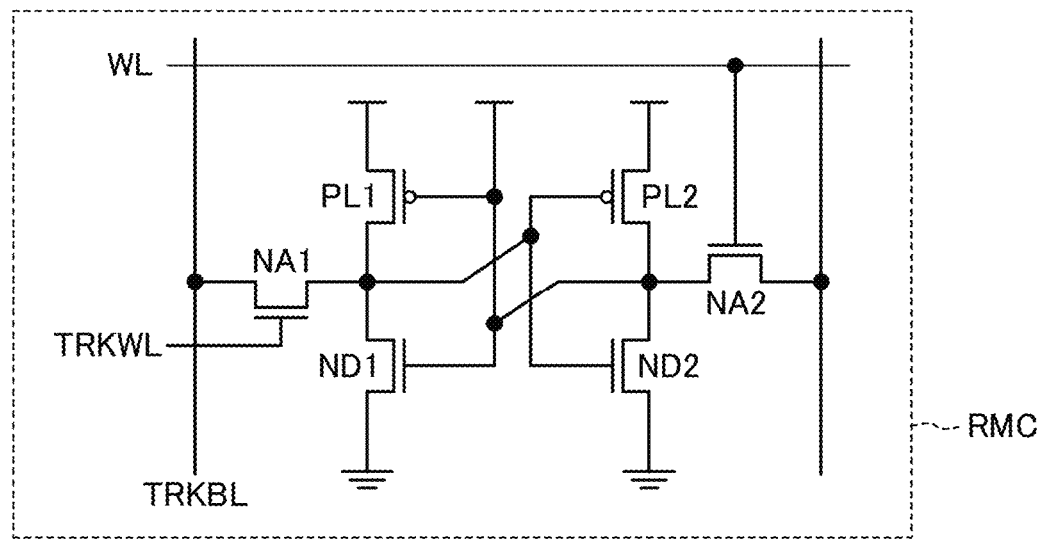
FIG. 3 is a view showing a circuit configuration example of a replica cell in FIG. 1A.

FIG. 3 is a circuit diagram showing an internal configuration of the replica memory cell RMC in FIG. 1A. In FIG. 3, the transistors constituting the replica memory cell RMC are the same in size as the transistors constituting the memory cell MC shown in FIG. 2.

The replica memory cell RMC is different from the memory cell MC in that, in the above-described latch circuit, the power supply voltage VDD is supplied to the gate of the p-type transistor PL1 and the gate of the n-type transistor ND1.

Also, the replica memory cell RMC is different from the memory cell MC in that the gate of the n-type transistor NA1 is connected to a replica word line TRKWL (hereinafter called the "TRKWL signal"). While the TRKWL signal for some replica memory cells RMC is connected to the word line driver 8, the TRKWL signal for the other replica memory cells RMC is connected to the ground potential VSS. By changing the number of replica memory cells RMC connected to the word line driver 8, the delay amount to be described later can be adjusted. Note that, in the following description, the replica memory cell RMC for which the TRKWL signal is connected to the word line driver 8 is called a first replica memory cell RMC, and the replica memory cell RMC for which the TRKWL signal is connected to the ground potential VSS is called a second replica memory cell RMC, in some cases, to distinguish one from the other. The signal input into the first replica memory cell RMC through the replica word line TRKWL is generated based on a precharge signal PCG (hereinafter called the "PCG signal") and a read enable signal RE (hereinafter called the "RE signal").

At the time of data read operation from the memory cell MC in the semiconductor memory device 1 (hereinafter simply called "at the read operation"), the TRKWL signal for the first replica memory cell RMC becomes an H level (also simply called 'H'), whereby a replica bit line TRKBL becomes an L level (also simply called 'L'). This results in output of a replica bit line signal TRKBL (hereinafter called the "TRKBL signal") from the first replica memory cell RMC. Based on the TRKBL signal, a sense amplifier startup signal SAE (hereinafter called the "SAE signal") to be described later is generated.

At the time of data write operation into the memory cell MC in the semiconductor memory device 1 (hereinafter simply called "at the write operation"), the TRKWL signal becomes 'L', whereby the first replica memory cell RMC does not operate. This results in that the first replica memory cell RMC and the second replica memory cell RMC only work as a load capacitance for the replica bit line TRKBL.

The replica bit line TRKBL is branched at the connecting position with the replica memory cell RMC located farthest from the amplifier circuit 2. The branched signal line is turned back at a position farther than the farthest replica memory cell RMC from the amplifier circuit 2, and connected to one input terminal of a NOR circuit 9.

The RE signal is input into the other input terminal of the NOR circuit 9. A signal line WATMG connected to the output terminal of the NOR circuit 9 extends to be in parallel with the replica bit line TRKBL.

The NOR circuit 9 outputs a fixed signal (L-level signal in the illustrated example) at the read operation and outputs a signal changing with the TRKBL signal at the write operation. The WATMG signal output from the NOR circuit 9 is used for write assist operation in the control circuit to be described later. Concrete write assist operation will be described later.

—Amplifier Circuit—

As shown in FIG. 1B, in this example, one amplifier circuit 2 is provided for every two columns. Specifically, the column connected to the bit line pair BLT[0] (hereinafter called the "first column") and the column connected to the bit line pair BLT[1] (hereinafter called the "second column") are connected to the amplifier circuit 2.

The amplifier circuit 2 includes a sense amplifier circuit 21, a write circuit, a negative potential boost signal generation circuit, and a negative potential generation circuit 25.

<Sense Amplifier Circuit>

The sense amplifier circuit 21 amplifies the signal on the bit line pair BLT in response to the SAE signal and outputs the amplified signal to a read data line pair RDT. The read data line pair RDT is constituted by paired read data lines RD and RDX.

More specifically, in this example, a column selector 23 is provided between each of the first and second columns and the sense amplifier circuit 21. The column selectors 23 select one of the first column and the second column based on column selection signals NRCA (NRCA[0] and NRCA[1]). The column selection signals NRCA are generated in column control circuits 22 based on column selection signals NCOL[1:0]. Hereinafter, the column selection signal NCOL [0] is simply expressed as NCOL[0], and the column selection signal NCOL[1] as NCOL[1]

The sense amplifier circuit 21, which receives a signal on the bit line pair BLT of the selected column, amplifies the signal and outputs the amplified signal to the read data line pair RDT.

An NSAE signal as an inverted signal of the SAE signal is generated in a signal generation circuit 63 of the control circuit 6 based on the TRKBL signal and an IWE signal. The signal generation circuit 63 and the IWE signal will be described later.

<Write Circuit>

The write circuit includes a write amplifier having a function of giving a high potential to one of the bit lines of the write-target bit line pair BLT and a low potential to the other bit line. The write amplifier further has a function of lowering the low potential-side bit line of the bit line pair BLT ("the other bit line" described above) to a negative potential in response to a negative potential boost signal BOOSTX (hereinafter called the "BOOSTX signal"). The write circuit also includes write drivers 26 driven with a write signal WRITE (hereinafter called the "WRITE signal"). The WRITE signal is generated based on a write enable signal WEB (hereinafter called the "WEB signal") and the PCG signal. Also, a precharge circuit 24 operating based on the PCG signal is provided for each column.

<Negative Potential Boost Signal Generation Circuit>

The negative potential boost signal generation circuit 27 is a circuit that generates the BOOSTX signal based on a timing adjustment signal NWTA (hereinafter called the NWTA signal) to be described later and supplies the signal to the write amplifier.

<RDCEN Signal Generation Circuit>

A signal generation circuit 54 generates a clock enable signal RDCEN (hereinafter called the "RDCEN signal") based on the TRKBL signal and the IWE signal. The IWE signal is an internal signal obtained by latching and inverting the WEB signal. That is, the IWE signal changes with the WEB signal.

In other words, the RDCEN signal is a signal used to activate the word line after a lapse of a predetermined time from the transition of the input clock signal. To state differently, the RDCEN signal is a signal that adjusts the timing of activating the word line WL from the transition of the input clock signal. Concrete functions of the RDCEN signal will be described in "Operation of Semiconductor Memory Device" later.

In this example, the signal generation circuit 54 is constituted by a NAND circuit that receives the TRKBL signal at one input terminal and the IWE signal at the other input terminal and outputs the RDCEN signal. To the one input terminal of the NAND circuit, a replica circuit of which the output signal changes with the WRITE signal is also connected, in addition to the replica bit line TRKBL.

The replica circuit is constituted by a first replica circuit 51, a second replica circuit 52, and a third replica circuit 53.

The first replica circuit 51 is a replica circuit of the write driver 26. Specifically, the first replica circuit 51 is a replica circuit using transistors same in size and polarity as those of the write driver 26, and configured so that the input-output delay amount be as identical as possible to that of the write driver 26. The WRITE signal input into the write driver 26 is also input into the first replica circuit 51

The second replica circuit 52 is a replica circuit for a route formed of an inverter IN1 and transistors TP1 and TN1 in FIG. 1B, and designed so that the input-output delay amount be as identical as possible to that of this route. The second replica circuit 52 receives the output signal of the first replica circuit 51.

The third replica circuit 53 is a replica circuit for a route formed of transistors TP2, TN2, and TN3 in FIG. 1B, and designed so that the input-output delay amount be as identical as possible to that of this route. The third replica circuit 53 receives the output signal of the second replica circuit 52, and its output is connected to the one input terminal of the NAND circuit of the signal generation circuit 54.

By providing the first to third replica circuits 51 to 53 in the generation route of the RDCEN signal that sets the timing of the BOOSTX signal, a delay equivalent to that in the operation of the write amplifier circuit can be generated.

—Control Circuit—

FIG. 1C shows a configuration example of the control circuit 6.

The control circuit 6 is a circuit that generates control signals for various units based on an input clock signal CLK (hereinafter called the "CLK signal") and various control signals. In this example, the control circuit 6 includes a clock generation circuit 61 and three signal generation circuits 62, 63, and 64.

<Clock Generation Circuit>

The clock generation circuit 61 generates an internal clock signal ICLK (hereinafter called the "ICLK signal") based on the CLK signal and a clock enable signal CEB.

<Signal Generation Circuit>

The signal generation circuit 62 generates an RDCLK signal, and its inverted signal, an NRDCLK signal, for controlling the word line driver. In this example, the signal generation circuit 62 is constituted by a NAND circuit receiving the RDCEN signal at one input terminal and the ICLK signal at the other input terminal and an inverter connected to the output of the NAND circuit.

Since the RDCEN signal is fixed to 'H' at the read operation, the RDCLK signal changes so that as the word line rise with rise of the ICLK signal (CLK signal). Also, in the signal generation circuit 62, at the write operation, the RDCLK signal changes so that the word line rise only when the RDCEN signal has become 'H' after the change of the ICLK signal.

More specifically, at the write operation, when the IWE signal is 'H' and the TRKBL signal falls, the RDCEN signal rises, whereby the RDCLK signal rises and the NRDCLK signal falls. With this signal change of the RDCLK signal and the NRDCLK signal, the rise of the word line WL in the driver circuit 82 in FIG. 1A is controlled. Note that the RDCLK signal and the NRDCLK signal (RDCEN signal) are adjusted so that the word line WL rise when the bit line signal BL (hereinafter called the "BL signal") has fallen down to the ground potential VSS. In other words, at the write operation, even if the ICLK signal changes, the word line WL will not rise until the BL signal falls down to the ground potential VSS. That is, control of delaying the rise of the word line WL works.

On the other hand, at the read operation, since the IWE signal is 'L', the RDCEN signal is fixed to 'H'. Therefore, the RDCLK signal and the NRDCLK signal change based on the ICLK signal irrespective of the TRKBL signal. As in the case of the write operation, the rise of the word line WL is controlled with the signal change of the RDCLK signal and the NRDCLK signal. In other words, at the read operation, the rise of the word line WL is controlled according to the change of the ICLK signal. That is, the control of delaying the rise of the word line WL does not work.

The signal generation circuit 63 generates the NSAE signal and a PCGSA signal based on the TRKBL signal and the IWE signal. The PCGSA signal is a signal obtained by enlarging the pulse width of the PCG signal.

The signal generation circuit 64 includes a combined circuit that generates the RE signal, the IWE signal, and the WRITE signal based on the WEB signal. The signal generation circuit 64 also includes a combined circuit that generates the NWTA signal based on the IWE signal, the ICLK signal, and the WATMG signal.

The NWTA signal is a signal used to activate the BOOSTX signal after a lapse of a predetermined time from the transition of the CLK signal so as to bring the low potential-side bit line of the write-target bit line pair BLT to a negative potential. Also, the NWTA signal is a signal that adjusts the timing of activating the BOOSTX signal from the transition of the CLK signal. Concrete functions of the NWTA signal will be described in "Operation of Semiconductor Memory Device" later.

—Operation of Semiconductor Memory Device—

Figure 4:
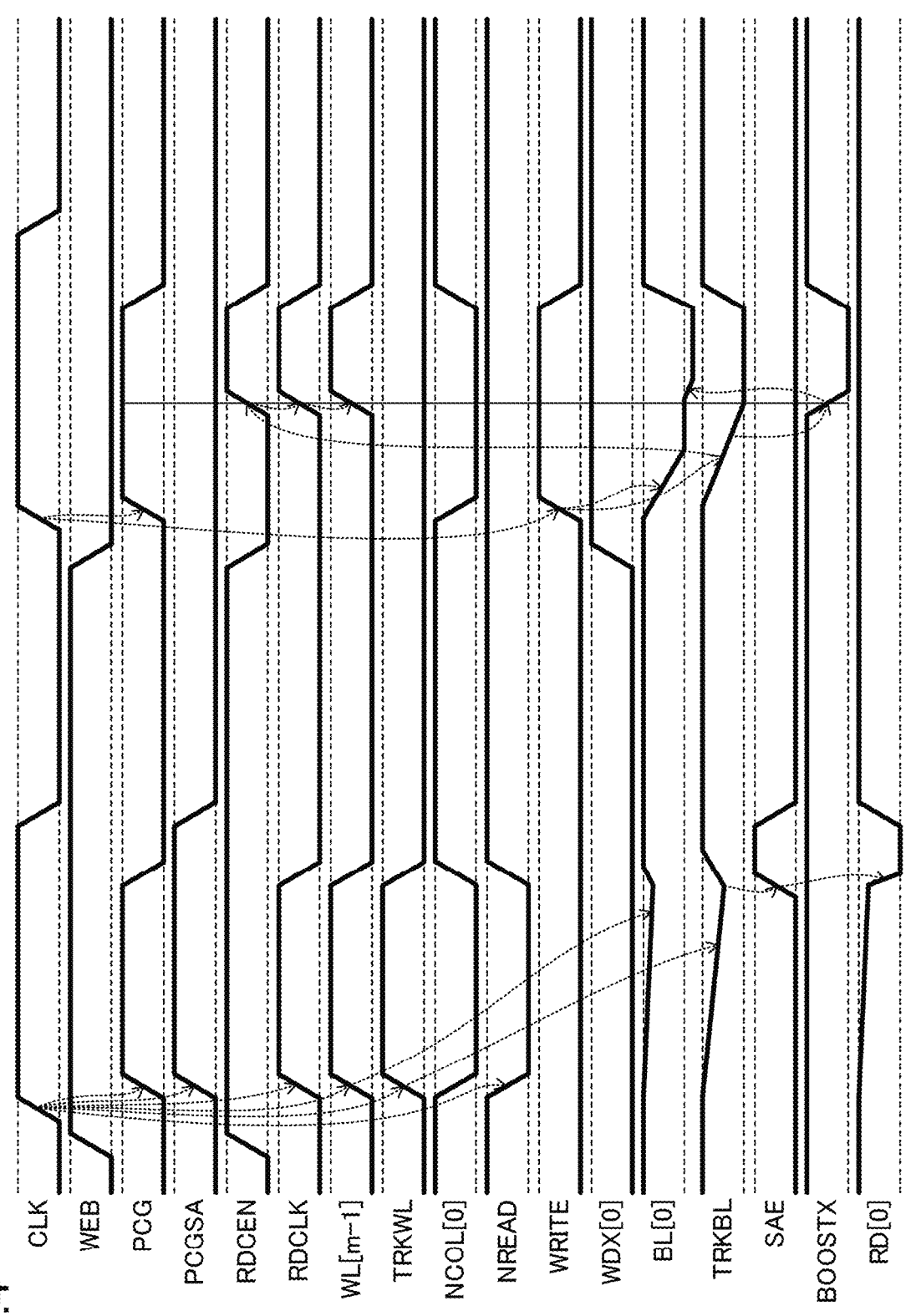
FIG. 4 is a timing chart showing an operation example of the semiconductor memory device (first embodiment).

Next, referring to FIG. 4, the data read operation from a memory cell MC and the data write operation into a memory cell MC in the semiconductor memory device 1 will be described.

<Data Read Operation>

The data read operation from a memory cell MC will be described. In this example, a case of selecting the first column by setting the column selection signal NCOL[0]='L' and reading the bit line BL[0]='L' will be described. Also, in this case, the memory cell row connected to WL[m−1] (see FIG. 1A) is selected.

Note that, in the following description, the bit line signal BL[0] is simply expressed as BL[0]. Likewise, the read data signal RD[0] is simply expressed as RD[0], and the read data signal RDX[0] as RDX[0].

First, before rise of the CLK signal, the WEB signal becomes 'H'.

After the 'H' state of the WEB signal is established and the CLK signal rises, the PCG signal and the PCGSA signal rise to 'H'. The PCGSA signal becomes 'H' only at the read operation.

With the rise of the PCG signal, the WL signal corresponding to the read-target memory cell MC and the TRKWL signal rise to 'H'. Also, almost simultaneously with the rise of the PCG signal, NCOL[0] and an NREAD signal fall to 'L'. The NREAD signal is a signal that changes based on the WEB signal and the PCG signal.

With the rise of the WL signal and the TRKWL signal to 'H', BL[0] and the TRKBL signal start to fall to 'L'.

Note here that the TRKBL signal has been adjusted to fall down to the threshold (e.g., ½ VDD) of a NOR circuit 65 (see FIG. 1C) when BL[0] has fallen to a level required for the sense amplifier operation. The NOR circuit 65 is a circuit that receives the TRKBL signal as an input.

The SAE signal changes based on the output of this NOR circuit. Specifically, when BL[0] has fallen to a level required for the sense amplifier operation, the SAE signal rises to 'H'. With this, the sense amplifier circuit 21 starts to operate, whereby 'L' is read as RD[0] and 'H' is read as RDX[0].

After the SAE signal becomes 'H', the PCG signal, the WL signal, and the TRKWL signal become 'L', and NCOL [0] and the NREAD signal become 'H', Thereafter, BL[0] is precharged to 'H'.

Once the read output is established, the PCGSA signal becomes 'L', and the SAE signal also becomes 'L', whereby the read operation is terminated. When the sense amplifier circuit 21 operates, 'L' is output as RD[0].

<Data Write Operation>

Next, the data write operation into a memory cell MC will be described. In this example, a case of selecting the first column by setting NCOL[0]='L' and writing a write data signal WDX[0]='H' to BL[0] will be described. That is, BL[0]='L' is to be written. Also, in this example, the memory cell row connected to WL[m−1] (see FIG. 1A) is selected.

Note that, in the following description, the write data signal WD[0] is simply expressed as WD[0], and the write data signal WDX[0] is simply expressed as WDX[0]. WDX [x] (x is a positive integer) is an inverted signal of WD[x].

First, before rise of the CLK signal, the WEB signal becomes 'L' and WDX[0] becomes 'H'. WD[x] and WDX

[x] hold the same states during the period for which the WL signal and the WRITE signal are 'H'.

After the 'L' state of the WEB signal is established and the CLK signal rises, the PCG signal rises to 'H'. The PCGSA signal remains 'L' during the data write.

When the WEB signal becomes 'L', the IWE signal becomes 'H', and the RDCEN signal is 'L' until the TRKBL signal falls to 'L'. During the time of the RDCEN signal being 'L', the RDCLK signal remains 'L' and the NRDCLK signal remains 'H'. Therefore, WL[m−1] remains 'L'.

With the rise of the PCG signal, the WRITE signal rises to 'H'. Also, almost simultaneously with the rise of the PCG signal, NCOL[0] falls to 'L', and BL[0] and the TRKBL signal start to fall to 'L'.

Note here that the TRKBL signal has been adjusted so that the RDCEN signal become 'H' at the timing when BL[0] has fallen down to the ground potential VSS. Therefore, after BL[0] falls down to the ground potential VSS, the RDCEN signal becomes 'H', and the RDCLK signal and WL[m−1] rise. Also, almost simultaneously with the rise of WL[m−1], the BOOSTX signal becomes 'L'. With this, since a WGND signal in the negative potential generation circuit 25 (see FIG. 1B) becomes a negative potential, the bit line signal BL[0] becomes a negative potential, whereby desired data ('L' in this example) is written into the write-target memory cell MC. Note that, when it is desired to write 'H' into the memory cell MC, WD[0] is to be made 'H' in place of WDX[0].

Once the write operation is terminated, the PCG signal, WL[m−1], and the WRITE signal become 'L' and NCOL[0] becomes 'H'. With the PCG signal becoming 'L', BL[0] is precharged to 'H'.

As described above, in this embodiment, as for the read operation, optimum startup timing can be given to the sense amplifier circuit 21 by using the replica memory cell RMC. Also, since the timing of activating the word line is not delayed at the read operation, decrease in read speed is avoided.

As for the write operation, by delaying the timing of activating the word line at the write operation, the potential of the bit line BL can be lowered sufficiently (to the ground potential VSS in this example) speedily with certainty. The word line is then activated after the potential of the bit line BL has fallen sufficiently.

Therefore, since a through current flowing through the bit line BL of the selected column can be prevented or reduced, reduction in power consumption is achieved.

Also, since the bit line BL is subjected to the boosting to a negative potential at the point where the potential is sufficiently low, the potential of the bit line BL can be made negative with certainty, whereby stable write operation can be achieved. This can improve the yield and the reliability. Moreover, since the bit line BL is subjected to the negative potential boosting at the point where the potential is sufficiently low, it is unnecessary to increase the capacitance value of a capacitive element for obtaining a negative potential, and thus increase in the area of the semiconductor memory device can be avoided.

Furthermore, since the time for which the word line is activated at the write operation is shortened, charge/discharge currents in unselected columns can be prevented or reduced, and thus reduction in power consumption is achieved.

Second Embodiment

Figure 5A:
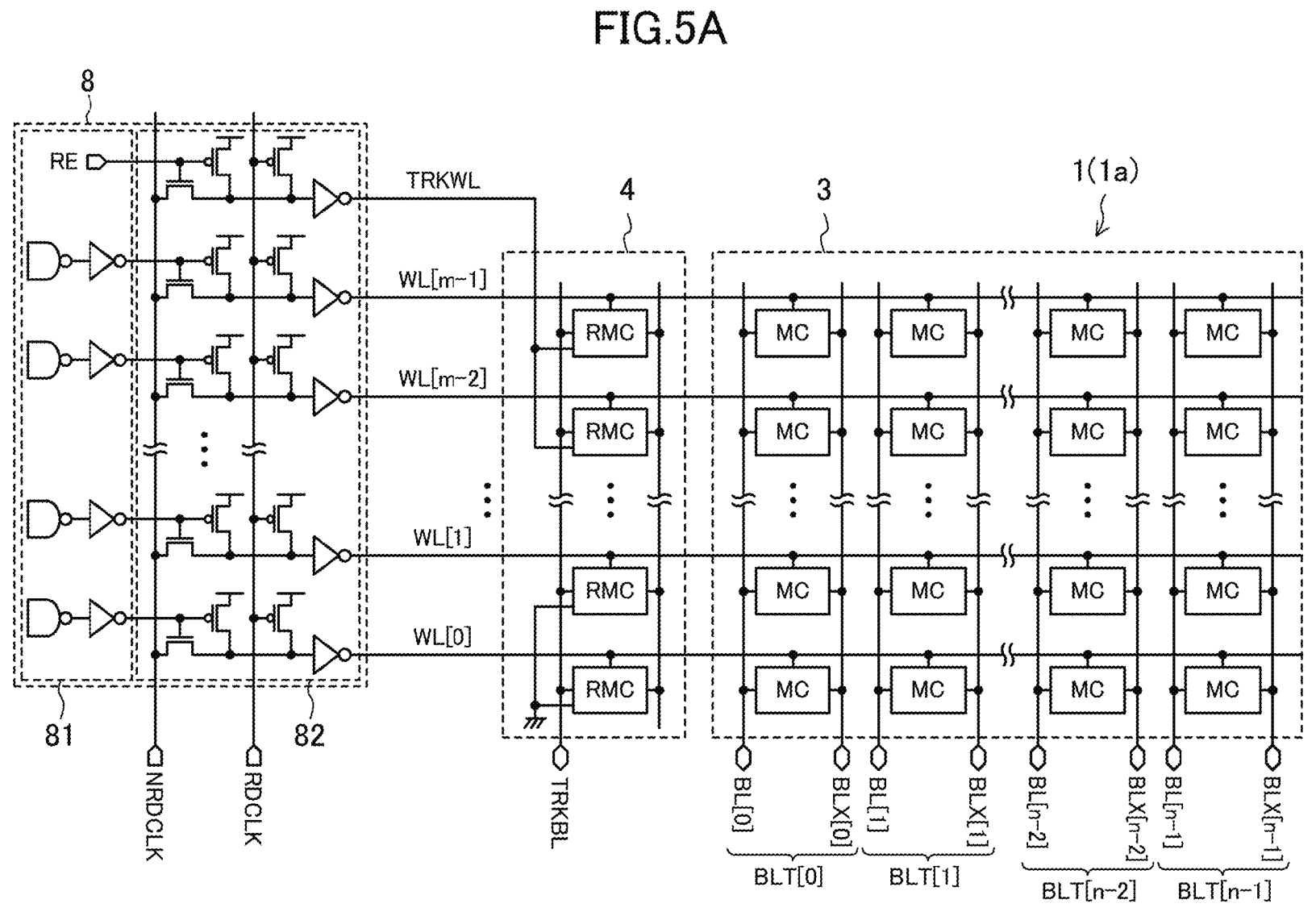
Figure 5B:
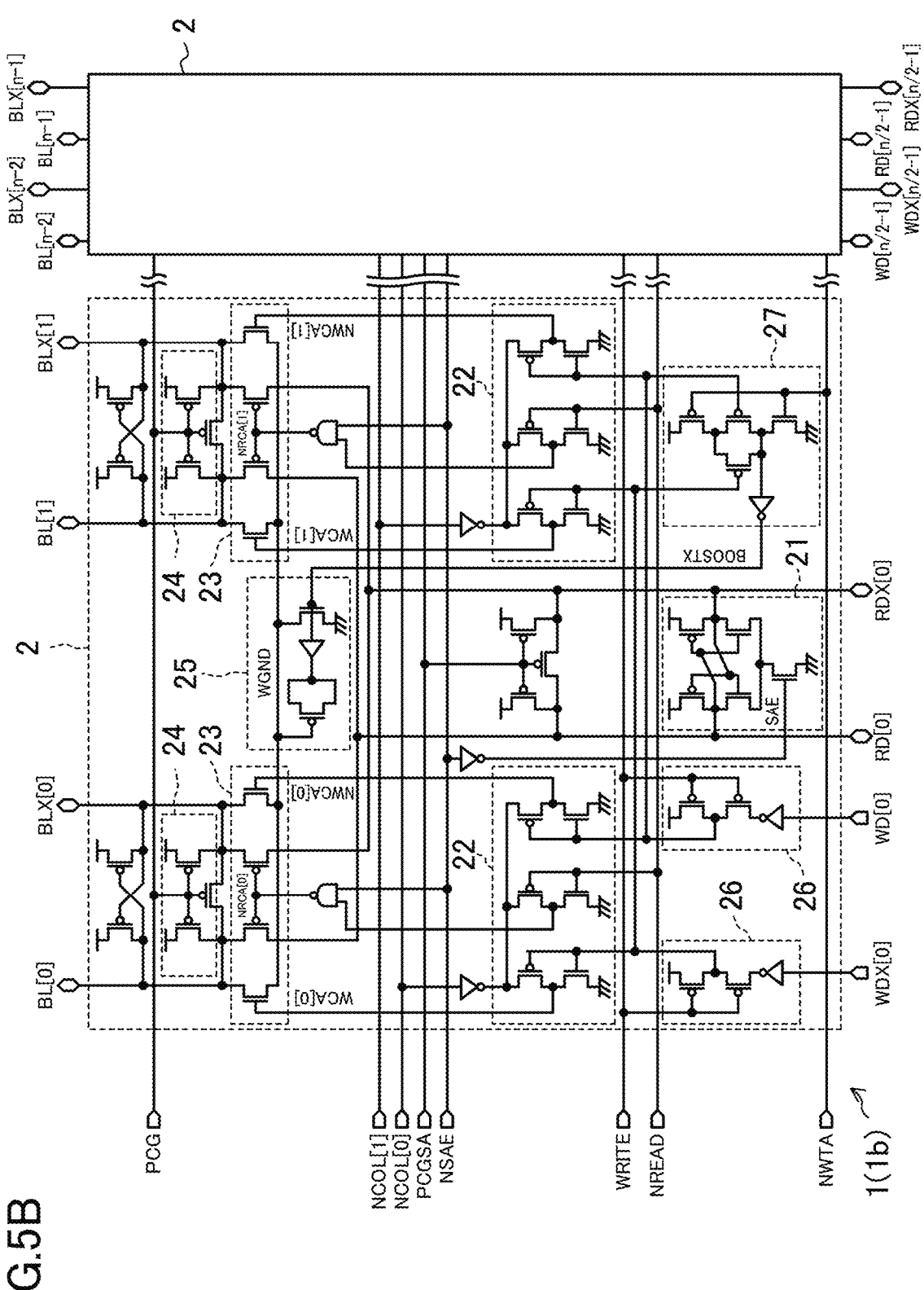
FIG. 5B is a view corresponding to FIG. 1B for the semiconductor memory device (second embodiment).
Figure 5C:
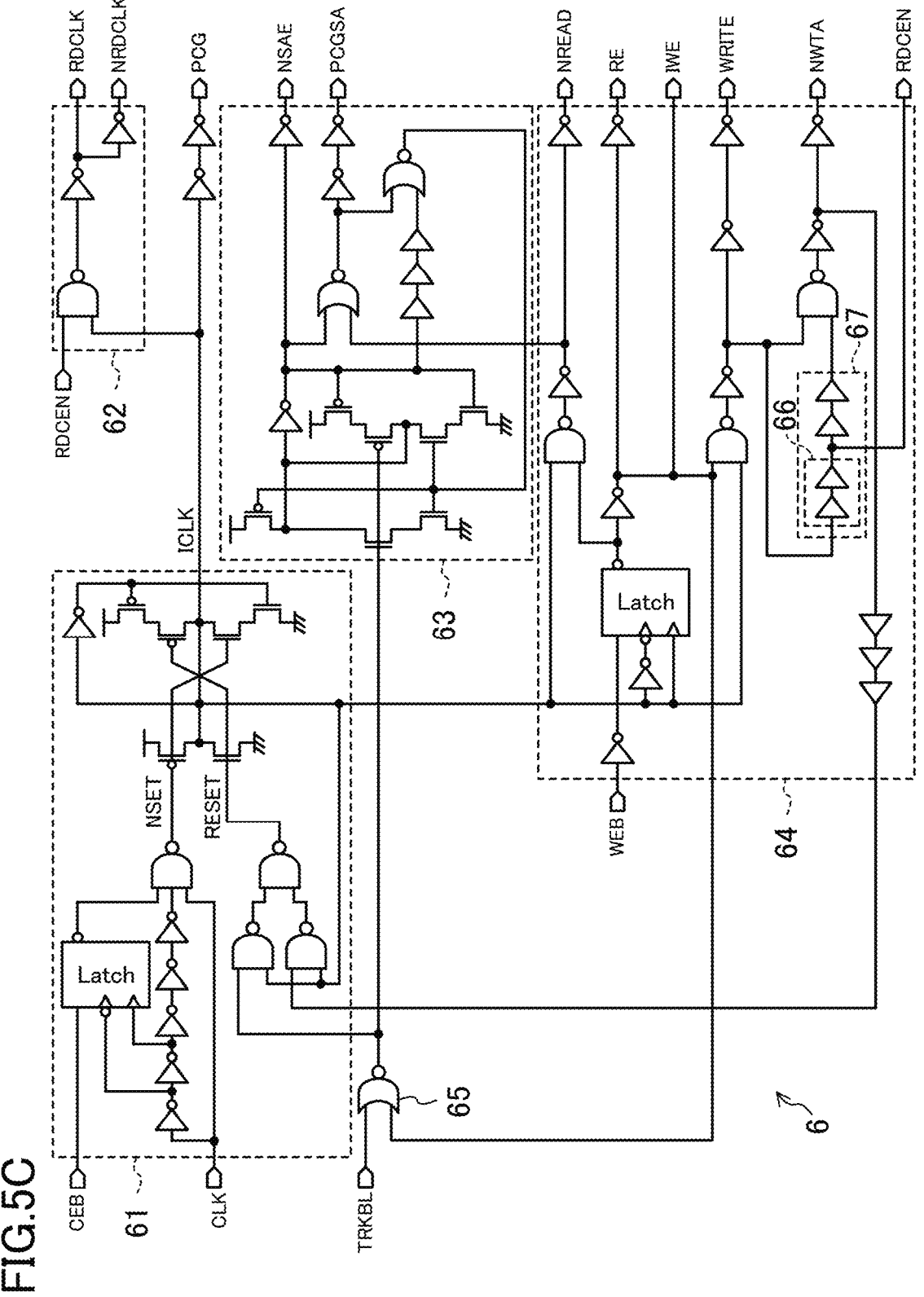
FIG. 5C is a view corresponding to FIG. 1C for the semiconductor memory device (second embodiment).

FIGS. 5A to 5C show a configuration example of a semiconductor memory device 1 of the second embodiment, in which FIG. 5A is a view corresponding to FIG. 1A, FIG. 5B is a view corresponding to FIG. 1B, and FIG. 5C is a view corresponding to FIG. 1C. In this embodiment, description will be made centering on points different from the first embodiment.

This embodiment is different from the first embodiment in that the WATMG signal (TRKBL signal) is not used for generation of the BOOSTX signal (NWTA signal), and also the TRKBL signal is not used for delaying the WL signal at the write operation.

Specifically, the NOR circuit 9 is omitted in FIG. 5A from the configuration of FIG. 1A. That is, in this embodiment, no WATMG signal is output from the configuration 1a of FIG. 5A.

In FIG. 5B, the signal generation circuit 54, the first replica circuit 51, the second replica circuit 52, and the third replica circuit 53 are omitted from the configuration of FIG. 1B. That is, in this embodiment, no RDCEN signal is output from the configuration 1b of FIG. 5B.

In FIG. 5C, the configuration is different from that of FIG. 1C in that a delay circuit 67 is provided in the signal generation circuit 64. In this example, the delay circuit 67 is constituted by a plurality of stages of buffers. In the example of FIG. 5C, the delay circuit 67 is constituted by four stages of buffers.

To the input terminal of the delay circuit 67, connected is the output of a combined circuit of AND logic that receives the ICLK signal and the IWE signal as the inputs. The input and output signals of the delay circuit 67 are input into a combined circuit of NAND logic, and the output signal of the combined circuit is the NWTA signal. In other words, the delay circuit 67 is a circuit that delays the timing so that the word line be activated after a lapse of a predetermined time (corresponding to the third predetermined time) from the transition of the CLK signal, and corresponds to the second delay circuit.

In this embodiment, as the RDCEN signal, used is the output of a buffer located midway among the plurality of stages of buffers constituting the delay circuit. In other words, in this example, the delay circuit 67 includes a delay circuit 66 that generates the RDCEN signal. The delay circuit 66 is a circuit that delays the timing so that the word line be activated after a lapse of a predetermined time (corresponding to the second predetermined time) from the transition of the CLK signal, and corresponds to the first delay circuit.

In other words, in the signal generation circuit 64, the timing of the change of the NWTA signal is set to be later than the timing of the change of the RDCEN signal. That is, in the delay circuit 67, the delay circuit 66 (2-stage buffers) for generating the RDCEN signal is provided, and another delay circuit (2-stage buffers) is additionally provided following the delay circuit 66, to generate the NWTA signal.

The other configuration of the second embodiment is the same as or similar to that of the first embodiment, and therefore detailed description thereof is omitted here.

—Operation of Semiconductor Memory Device—

Figure 6:
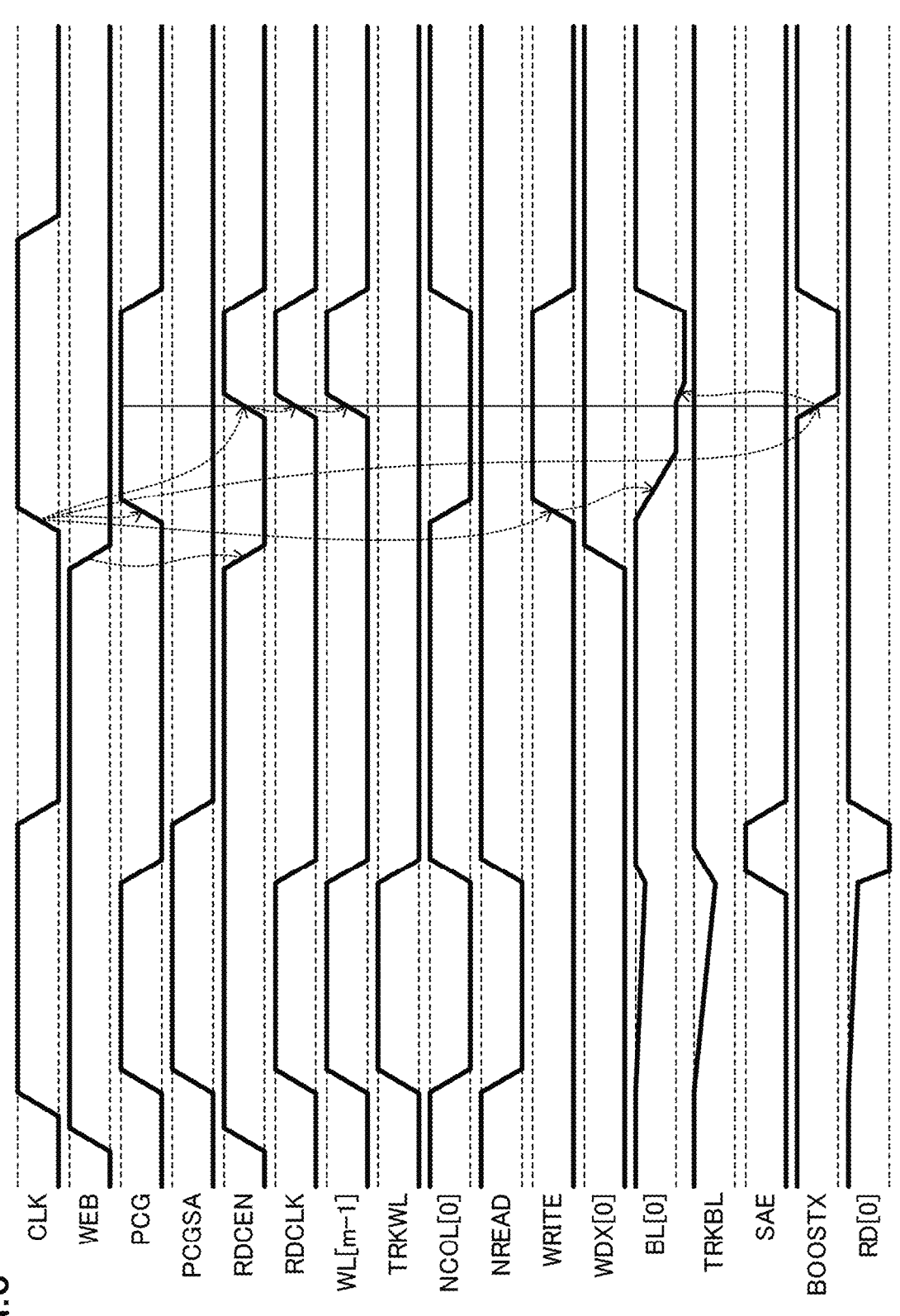
FIG. 6 is a timing chart showing an operation example of the semiconductor memory device (second embodiment).

Next, referring to FIG. 6, the data write operation into a memory cell MC in the semiconductor memory device 1 will be described. Note that the data read operation is the same as that shown in FIG. 4.

<Data Write Operation>

In this example, as in the first embodiment, a case of writing BL[0]='L' will be described.

First, before rise of the CLK signal, the WEB signal becomes 'L' and WDX[0] becomes 'H'. WD[x] and WDX

[x] hold the same states during the period for which the WL signal and the WRITE signal are 'H'.

After the 'L' state of the WEB signal is established and the CLK signal rises, the PCG signal rises to 'H'. The PCGSA signal remains 'L' during the data write.

With the rise of the PCG signal, the WRITE signal rises to 'H', and almost simultaneously, NCOL[0] falls to 'L'. With this, BL[0] falls to 'L'.

Note here that the timing of the change of the RDCEN signal from the rise of the CLK signal has been adjusted by the function of the delay circuit 67. Therefore, after BL[0] falls down to the ground potential VSS, the RDCEN signal becomes 'H', and the RDCLK signal and WL[m–1] rise. Also, almost simultaneously with the rise of WL[m–1], the BOOSTX signal becomes 'L'. With this, since a WGND signal in the negative potential generation circuit 25 (see FIG. 5B) becomes a negative potential, the bit line signal BL[0] becomes a negative potential, whereby desired data ('L' in this example) is written into the write-target memory cell MC.

Once the write operation is terminated, the PCG signal, WL[m–1], and the WRITE signal become 'L' and NCOL[0] becomes 'H'. With the PCG signal becoming 'L', BL[0] is precharged to 'H'. Note that, in this embodiment, unlike the first embodiment, the TRKBL signal does not change during the write operation.

As described above, in this embodiment, as in the first embodiment, since the timing of activating the word line is not delayed at the read operation, decrease in read speed is avoided. As for the write operation, also, similar effects to those in the first embodiment are obtained.

Specifically, by delaying the timing of activating the word line at the write operation, the potential of the bit line BL can be lowered sufficiently (to the ground potential VSS in this example) speedily with certainty. The word line is then activated after the potential of the bit line BL has fallen sufficiently.

Therefore, since a through current flowing through the bit line BL of the selected column can be prevented or reduced, reduction in power consumption is achieved.

Also, since the bit line BL is subjected to the boosting to a negative potential at the point where the potential is sufficiently low, the potential of the bit line BL can be made negative with certainty, whereby stable write operation can be achieved. This can improve the yield and the reliability. Moreover, since the bit line BL is subjected to the negative potential boosting at the point where the potential is sufficiently low, it is unnecessary to increase the capacitance value of a capacitive element for obtaining a negative potential, and thus increase in the area of the semiconductor memory device can be avoided.

Furthermore, since the time for which the word line is activated at the write operation is shortened, charge/discharge currents in unselected columns can be prevented or reduced, and thus reduction in power consumption is achieved.

Also, since the device is implemented by simple circuits compared with the first embodiment, the area can be made smaller than in the first embodiment.

According to the present disclosure, circuits that generate various operation signals for a semiconductor memory device at appropriate timing can be implemented without an area overhead. The present disclosure is therefore highly useful.

The invention claimed is:

1. A semiconductor memory device performing read operation and write operation in response to an input clock signal, comprising:
a memory cell array including a plurality of memory cells, each of the plurality of memory cells being connected to a corresponding word line and a corresponding bit line pair; and
a write circuit having a function of giving a low potential to one bit line of the bit line pair connected to the memory cell of a write target, and bringing the low potential-side bit line to a negative potential in response to a negative potential boost signal,
wherein
at a data read operation from the memory cell, the word line is activated after a lapse of a first predetermined time from a transition of the input clock signal, to read a memory value of the memory cell, and
at a data write operation into the memory cell, the word line is activated after a lapse of a second predetermined time longer than the first predetermined time from a transition of the input clock signal, and the negative potential boost signal is activated after a lapse of a third predetermined time longer than the first predetermined time, to bring the low potential-side of the bit line pair to a negative potential.

2. The semiconductor memory device of claim 1, further comprising
a replica bit line circuit including a plurality of replica memory cells, each of the plurality of replica memory cells outputting a replica bit line signal to a common replica bit line in response to a replica word line signal,
wherein
the semiconductor memory device is configured to activate the word line after a lapse of the second predetermined time from a transition of the input clock signal and activate the negative potential boost signal after a lapse of the third predetermined time, based on the replica bit line signal, at the write operation.

3. The semiconductor memory device of claim 1, further comprising:
a first delay circuit outputting a clock enable signal that delays timing so that the word line be activated after a lapse of the second predetermined time from a transition of the input clock signal at the write operation; and
a second delay circuit outputting a timing adjustment signal that delays timing so that the negative potential boost signal be activated after a lapse of the third predetermined time from a transition of the input clock signal at the write operation.

4. The semiconductor memory device of claim 3, wherein
a delay amount of the timing adjustment signal with respect to the transition of the input clock signal is greater than a delay amount of the clock enable signal with respect to the transition of the input clock signal.

* * * * *